(12) United States Patent
Wang et al.

(10) Patent No.: US 12,457,831 B2
(45) Date of Patent: Oct. 28, 2025

(54) DISPLAY PANEL AND FORMING METHOD THEREOF

(71) Applicant: AUO Corporation, Hsin-Chu (TW)

(72) Inventors: Sheng-Chin Wang, Hsin-Chu (TW); Kuan-Hsun Chen, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 577 days.

(21) Appl. No.: 18/070,936

(22) Filed: Nov. 29, 2022

(65) Prior Publication Data

US 2023/0207751 A1 Jun. 29, 2023

(30) Foreign Application Priority Data

Dec. 24, 2021 (TW) .................................. 110148729

(51) Int. Cl.
*H10H 20/853* (2025.01)
*H01L 25/075* (2006.01)
*H10H 20/01* (2025.01)

(52) U.S. Cl.
CPC ....... *H10H 20/853* (2025.01); *H01L 25/0753* (2013.01); *H10H 20/01* (2025.01); *H10H 20/0362* (2025.01)

(58) Field of Classification Search
CPC .. H10H 20/853; H10H 20/01; H10H 20/0362; H10L 25/0753
See application file for complete search history.

(56) References Cited

U.S. PATENT DOCUMENTS

| | | | | |
|---|---|---|---|---|
| 2019/0006198 A1* | 1/2019 | Jang | ..................... | H01L 23/3128 |
| 2020/0163233 A1* | 5/2020 | Brackley | ............... | H01L 23/544 |
| 2022/0246808 A1* | 8/2022 | Choi | ...................... | H10H 20/83 |
| 2023/0207766 A1* | 6/2023 | Lin | ...................... | H10H 20/853 |
| | | | | 257/79 |
| 2024/0194652 A1* | 6/2024 | Hsieh | ................. | H10H 20/8506 |

FOREIGN PATENT DOCUMENTS

| | | | | | |
|---|---|---|---|---|---|
| CN | 106384775 | A | * | 2/2017 | ......... H10H 20/8581 |
| CN | 106549094 | A | * | 3/2017 | ......... H10H 20/8516 |
| CN | 206322437 | U | | 7/2017 | |
| CN | 111627342 | A | | 9/2020 | |
| CN | 114613799 | A | * | 6/2022 | ............ H01L 25/13 |
| TW | 201712900 | A | | 4/2017 | |
| TW | 201906028 | A | | 2/2019 | |

* cited by examiner

*Primary Examiner* — Mary Ellen Bowman
(74) *Attorney, Agent, or Firm* — WPAT, PC (57) ABSTRACT

A display panel includes a package including a substrate, LEDs and a encapsulation adhesive. The substrate includes a bottom surface, a first side and a second side. The first side and the second side are opposite sides, and the bottom surface and the first side form a first angle, the bottom surface and the second side form a second angle. The LEDs are on the substrate. The encapsulation adhesive covers the first side, the second side and the light-emitting diodes. The encapsulation adhesive has a third side adjacent to the first side and a fourth side adjacent to the second side, and the bottom surface and the third side form a third angle, the bottom surface of the first substrate and the fourth side form a fourth angle. The third angle is greater than the first angle, and the fourth angle is smaller than the second angle.

20 Claims, 7 Drawing Sheets

DISPLAY PANEL AND FORMING METHOD THEREOF

CROSS-REFERENCE TO RELATED APPLICATION

This application claims priority to Taiwan Application Serial Number 110148729, filed Dec. 24, 2021, which are herein incorporated by reference in its entirety.

BACKGROUND

Field of Invention

The present disclosure relates to a display panel and a forming method thereof.

Description of Related Art

As the techniques of the display panels keep improving, applications of the display panels are more common. The display panels may be formed by tiling multiple packages having light-emitting diodes, and each of the packages may represent different pixel to display images.

SUMMARY

Some embodiments of the present disclosure provide a display panel, including a first package. The first package includes a first substrate, a plurality of first light-emitting diodes and a first encapsulation adhesive. The first substrate includes a bottom surface, a first side and a second side. The first side of the first substrate and the second side of the first substrate are opposite sides, and the bottom surface of the first substrate and the first side of the first substrate form a first angle, the bottom surface of the first substrate and the second side of the first substrate form a second angle. The first light-emitting diodes are on the first substrate. The first encapsulation adhesive covers the first side of the first substrate, the second side of the first substrate and the first light-emitting diodes. The first encapsulation adhesive has a third side adjacent to the first side of the first substrate and a fourth side adjacent to the second side of the first substrate, and the bottom surface of the first substrate and the third side of the first encapsulation adhesive form a third angle, the bottom surface of the first substrate and the fourth side of the first encapsulation adhesive form a fourth angle. The third angle is greater than the first angle, and the fourth angle is smaller than the second angle.

In some embodiments, the first angle and the second angle are right angles.

In some embodiments, as getting farther away from the bottom surface of the first substrate, the third side of the first encapsulation adhesive is getting farther away from the first side of the first substrate, and the fourth side of the first encapsulation adhesive is getting closer to the second side of the first substrate.

In some embodiments, the display panel further includes a second package adjacent to and in contact with the first package. The second package includes a second substrate, a plurality of second light-emitting diodes and a second encapsulation adhesive. The second substrate includes a bottom surface and a fifth side. The fifth side of the second substrate is adjacent to the second side of the first substrate. The second light-emitting diodes are on the second substrate. The second encapsulation adhesive covers the fifth side of the second substrate and the second light-emitting diodes. The second encapsulation adhesive has a sixth side adjacent to the fifth side of the second substrate, and the bottom surface of the second substrate and the sixth side of the second encapsulation adhesive form a fifth angle, one of the fifth angle and the fourth angle is an acute angle, and the other is an obtuse angle.

In some embodiments, the fifth angle and the fourth angle are supplementary angles.

In some embodiments, a top surface and the fourth side of the first encapsulation adhesive form a sixth angle, and the sixth angle is greater than the second angle.

Some embodiments of the present disclosure provide a display panel including a first package and a second package. The first package includes a first substrate, a plurality of first light-emitting diodes and a first encapsulation adhesive. The first substrate includes a bottom surface, a first side and a second side. The first side of the first substrate and the second side of the first substrate are opposite sides. The first light-emitting diodes on the first substrate. The first encapsulation adhesive covers the first side of the first substrate, the second side of the first substrate and the first light-emitting diodes. The first encapsulation adhesive has a third side adjacent to the first side of the first substrate and a fourth side adjacent to the second side of the first substrate. The second package includes a second substrate, a plurality of second light-emitting diodes and a second encapsulation adhesive. The second substrate includes a bottom surface, a fifth side and a sixth side. The fifth side and the sixth side of the second substrate are opposite sides. The fifth side of the second substrate is adjacent to the second side of the first substrate. The second light-emitting diodes are on the second substrate. The second encapsulation adhesive covers the fifth side of the second substrate and the second light-emitting diodes. The second encapsulation adhesive has a seventh side, the seventh side of the second encapsulation adhesive of the second package is in contact with the fourth side of the first encapsulation adhesive of the first package and are inclined toward the same direction.

In some embodiments, a top surface of the first substrate is narrower than the bottom surface of the first substrate, and an edge of the bottom surface and an edge of the top surface of the first substrate have a first horizontal distance therebetween, and a top surface of the second substrate is wider than the bottom surface of the second substrate, and an edge of the bottom surface and an edge of the top surface of the second substrate have a second horizontal distance therebetween.

In some embodiments, the first horizontal distance is smaller than a thickness of the first substrate, and the second horizontal distance is smaller than a thickness of the second substrate.

In some embodiments, the first side and the bottom surface of the first substrate of the first package form a first angle, and the second side and the bottom surface of the first substrate of the first package form a second angle, the first angle and the second angle are from 45 degrees to 90 degrees.

In some embodiments, the fifth side and the bottom surface of the second substrate of the second package form a third angle, and the sixth side and the bottom surface of the second substrate of the second package form a fourth angle, the third angle and the fourth angle are from 90 degrees to 135 degrees.

Some embodiments of the present disclosure provide a method of forming a display panel includes disposing a plurality of first light-emitting diodes on a first substrate. The first substrate includes a bottom surface, a first side and a second side, the first side of the first substrate and the second side of the first substrate are opposite sides, and the bottom surface of the first substrate and the first side of the first substrate form a first angle, the bottom surface of the first substrate and the second side of the first substrate form a second angle. A first encapsulation adhesive is disposed, so that the first encapsulation adhesive covers the first side of the first substrate, the second side of the first substrate and the first light-emitting diodes. The first encapsulation adhesive is cut along a first direction from the first substrate toward the first light-emitting diodes, and forming a third side of the first encapsulation adhesive. The first encapsulation adhesive is cut along a second direction from the first light-emitting diodes toward the first substrate, and forming a fourth side of the first encapsulation adhesive to form a first package.

In some embodiments, a distance between the third side and the first side is smaller than a distance between the fourth side and the second side at an extension direction of the bottom surface.

In some embodiments, the method further includes cutting a second encapsulation adhesive of a second package along a third direction, and forming a fifth side of the second encapsulation adhesive of the second package. The third direction is opposite to the second direction. The second package is arranged adjacent to the fourth side of the first package.

In some embodiments, the third side of the first encapsulation adhesive and the bottom surface of the first substrate form a third angle, the fourth side of the first encapsulation adhesive and the bottom surface of the first substrate form a fourth angle, wherein the third angle is greater than the first angle, and the fourth angle is smaller than the second angle.

In some embodiments, the fifth side of the second encapsulation adhesive of the second package is in contact with the first encapsulation adhesive of the first package, and the fifth side of the second encapsulation adhesive and the bottom surface of a second substrate of the second package form a fifth angle, one of the fifth angle and the fourth angle is an acute angle, and the other is an obtuse angle.

In some embodiments, the fifth angle and the fourth angle are supplementary angles.

In some embodiments, the fourth side of the first encapsulation adhesive overlaps the fifth side of the second encapsulation adhesive in a vertical direction.

In some embodiments, the method further includes cutting the second encapsulation adhesive of the second package along a fourth direction, and forming a sixth side of the second encapsulation adhesive of the second package. The third direction is opposite to the fourth direction.

In some embodiments, the third side and the fourth side are inclined toward the same side.

As mentioned above, in the present disclosure, the encapsulation adhesive may be cut in opposite directions. The cut encapsulation adhesive may have the sides inclined toward the same direction. When tiling different packages together, the gap between the packages does not easily affect the image generated by the display panel.

It is to be understood that both the foregoing general description and the following detailed description are by examples, and are intended to provide further explanation of the invention as claimed. It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure are related to a method of cutting packages. Specifically, in the present disclosure, the encapsulation adhesives at the two sides of the packages are cut along opposite directions. The cut encapsulation adhesive has sides inclined toward the same direction. When tiling different packages together, the tiling widths between the packages are reduced to reduce the visual interference resulting from the tiling widths.

Figure 1:
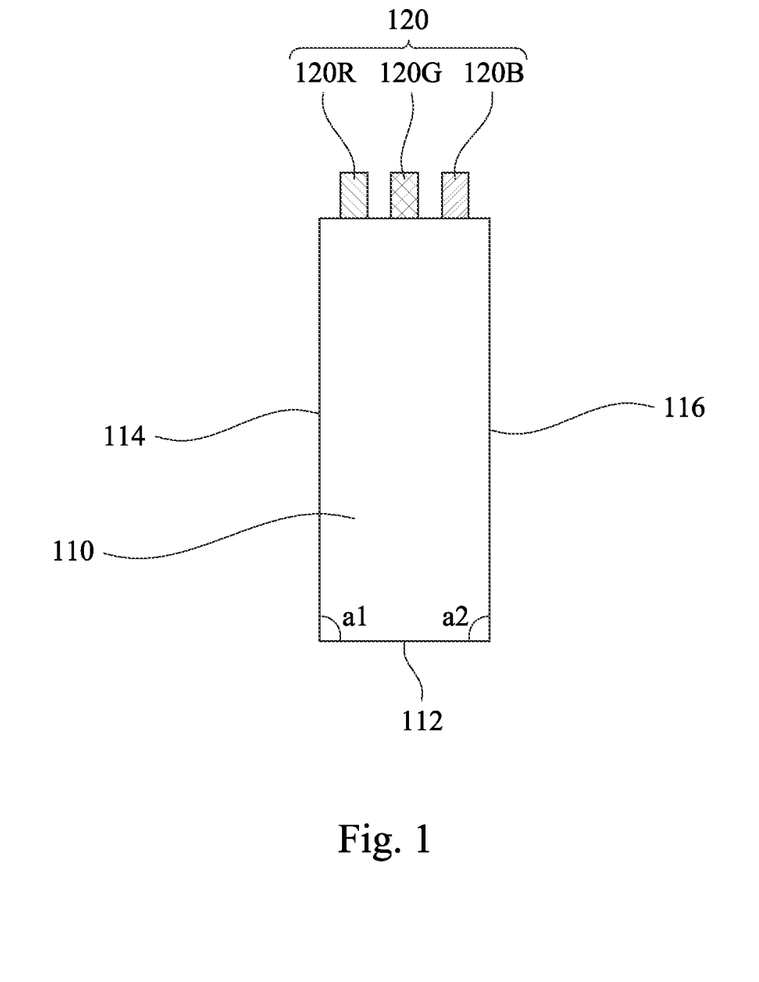
FIGS. 1-6 illustrate cross-section views of intermediate stages of a manufacturing method of a display panel in some embodiments of the present disclosure.

FIGS. 1-6 illustrate cross-section views of intermediate stages of a manufacturing method of a display panel in some embodiments of the present disclosure. Referring to FIG. 1, a first substrate 110 is provided. The first substrate 110 has a bottom surface 112, a first side 114 and a second side 116. The first side 114 of the first substrate 110 and the second side 116 of the first substrate 110 are opposite sides. The bottom surface 112 and the first side 114 of the first substrate 110 form a first angle a1, the bottom surface 112 and the second side 116 of the first substrate 110 form a second angle a2. More specifically, the first angle a1 is the angle between the extended surface of the planar portion of the first side 114 and the extended surface of the bottom surface 112, and the second angle a2 is the angle between the extended surface of the planar portion of the second side 116 and the extended surface of the bottom surface 112. Therefore, in some embodiments, even though the first side 114 and the bottom surface 112 have a chamfer therebetween, and the second side 116 and the bottom surface 112 have a chamfer therebetween, the first substrate 110 still has the first angle a1 and the second angle a2. In some embodiments, the first angle a1 and the second angle a2 are from about 80 degrees to about 100 degrees. For example, the first angle a1 and the second angle a2 are right angles. In some embodiments, the first substrate 110 may be made of any suitable material, such as glass.

In FIG. 1, a plurality of first light-emitting diodes 120 are disposed on the first substrate 110, so that the first light-emitting diodes 120 are on the first substrate 110. In some embodiments, the first light-emitting diodes 120 may include a red light-emitting diode chip 120R, a green light-emitting diode chip 120G, and a blue light-emitting diode chip 120B, as show in FIG. 1. However, the color and the number of the first light-emitting diodes 120 are not limited to those shown in FIG. 1. For example, the first light-emitting diodes 120 may also include a yellow light-emitting diode chip, and/or the number of each of the red light-emitting diode chip 120R, the green light-emitting diode chip 120G, and the blue light-emitting diode chip 120B may be more than 1. In some embodiments, the first light-emitting diodes 120 are mini light-emitting diode chips or micro light-emitting diode chips.

Figure 2:
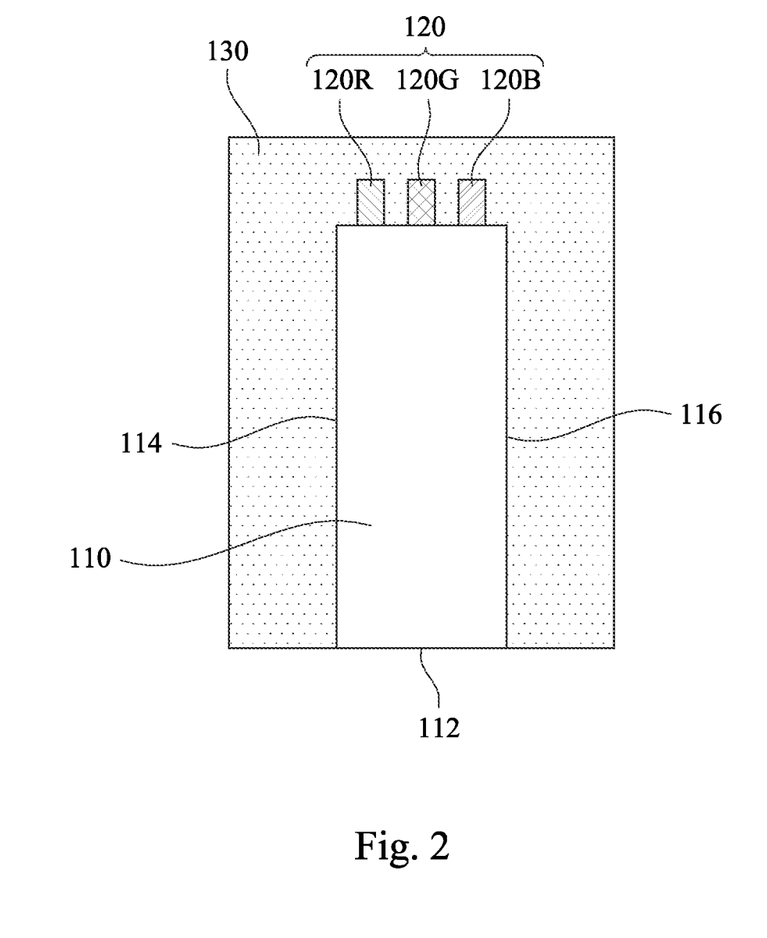

Referring to FIG. 2, a first encapsulation adhesive 130 is disposed, so that the first encapsulation adhesive 130 covers the first side 114 of the first substrate 110, the second side 116 of the first substrate 110 and the first light-emitting diodes 120. In some embodiments, the first encapsulation adhesive 130 may be made of epoxy resin, silicone gel or the like, and the first encapsulation adhesive 130 may be doped with black particles, such as carbon powder, to enhance shading effect and prevent interference of electromagnetic waves.

Figure 3:
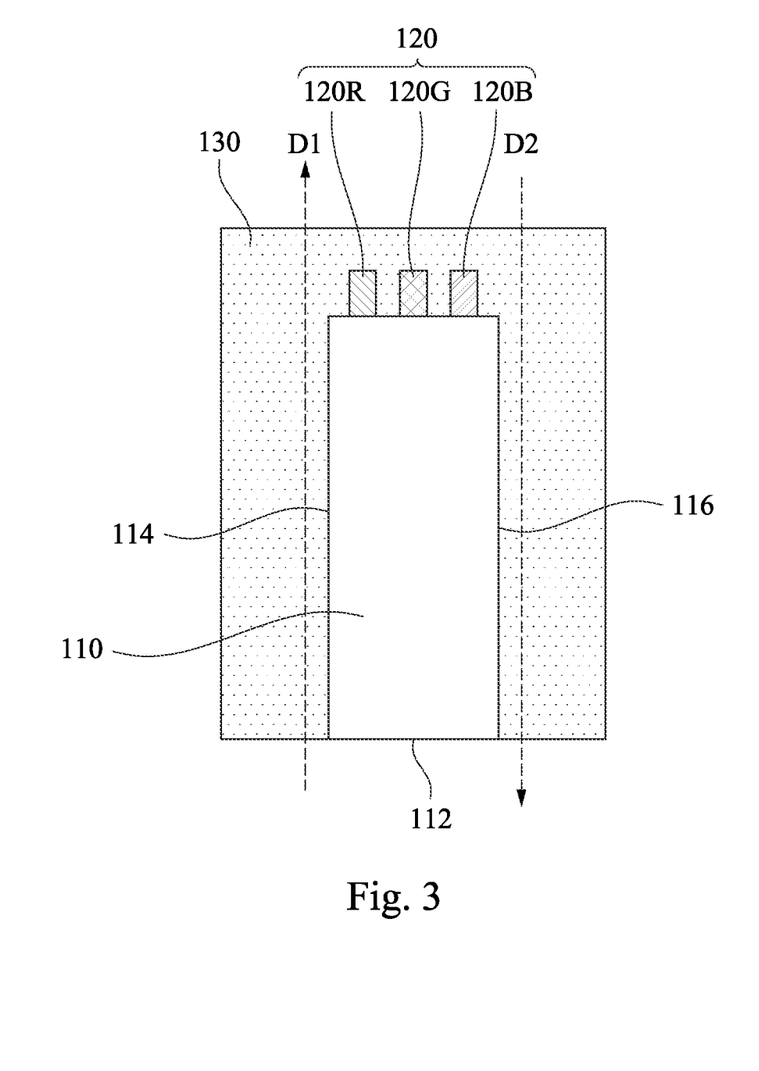
Figure 4:
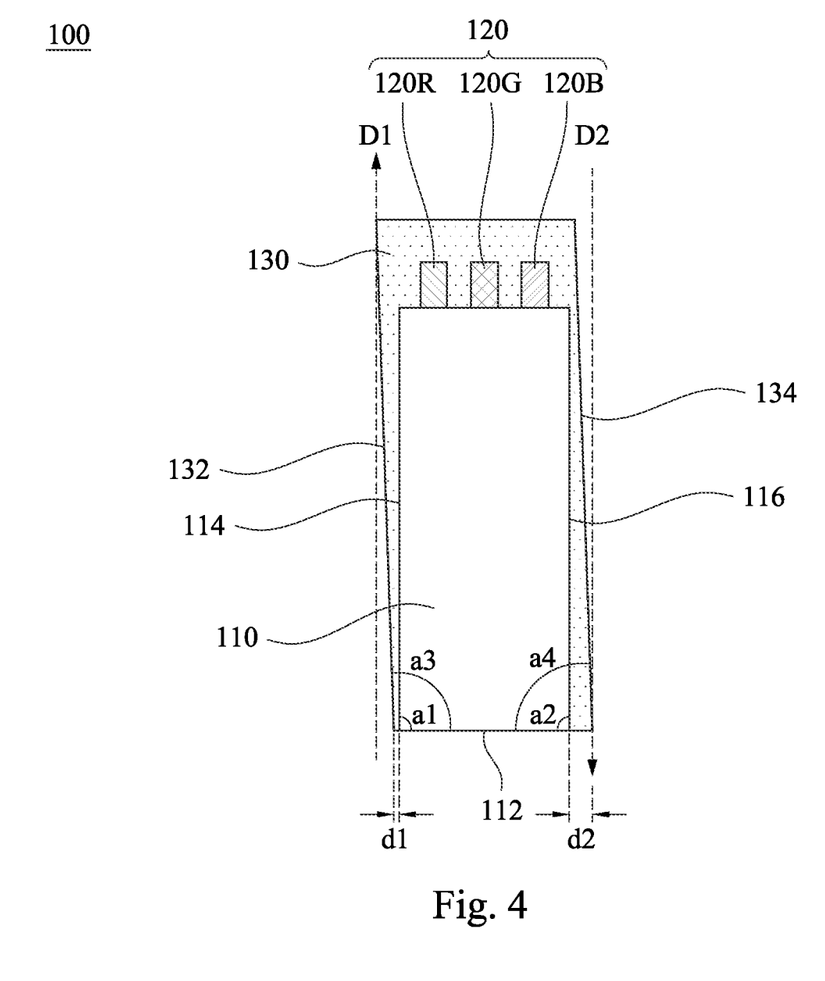

Referring to FIGS. 3-4, the first encapsulation adhesive 130 is cut along a first direction D1 from the first substrate 110 toward the first light-emitting diodes 120, and a third side 132 of the first encapsulation adhesive 130 is formed. Subsequently, the first encapsulation adhesive 130 is cut along a second direction D2 from the first light-emitting diodes 120 toward the first substrate 110, and a fourth side 134 of the first encapsulation adhesive 130 is formed to form a first package 100, as shown in FIG. 4. Specifically, excessive first encapsulation adhesive 130 is cut along the first side 114 of the first substrate 110 in the first direction D1. Subsequently, excessive first encapsulation adhesive 130 is cut along the second side 116 of the first substrate 110 in the second direction D2. The first direction D1 and the second direction D2 are perpendicular to the bottom surface 112 of the first substrate 110. When cutting the first encapsulation adhesive 130, a horizontal distance is between the cut and the side of the first substrate 110. Therefore, after cutting the first encapsulation adhesive 130, the first encapsulation adhesive 130 still covers the first side 114 of the first substrate 110, the second side 116 of the first substrate 110 and the first light-emitting diodes 120, and the first encapsulation adhesive 130 has the third side 132 adjacent to the first side of 114 the first substrate 110 and the fourth side 134 adjacent to the second side 116 of the first substrate 110. The first side 114 of the first substrate 110 does not overlaps the third side 132 of the first encapsulation adhesive 130, and the second side 116 of the first substrate 110 does not overlaps the fourth side 134 of the first encapsulation adhesive 130. As such, the first encapsulation adhesive 130 still covers the first side 114 of the first substrate 110 and the second side 116 of the first substrate 110, so that the first encapsulation adhesive 130 may prevent the crash between the first substrates 110 during the operation of tiling the first packages 100, thereby reducing the damage of the first packages 100.

The first encapsulation adhesive 130 may be cut by any suitable method. In some embodiments, the first encapsulation adhesive 130 is cut by laser cutting, dicing saw or the like. Due to the characteristics of the cutting process, when cutting the first encapsulation adhesive 130, the formed side is not entirely parallel to the cutting direction. Therefore, the third side 132 of the first encapsulation adhesive 130 is not parallel to the first direction D1, and the fourth side 134 of the first encapsulation adhesive 130 is not parallel to the second direction D2. Specifically, when using the laser cutting, since the laser cutting head is tapered, a larger opening is formed at the cut when cutting the first encapsulation adhesive 130. On the other hand, when using the dicing saw, the dicing saw reacts with the first encapsulation adhesive 130, for example, the cut first encapsulation adhesive 130 may generate heat or fines from friction, so that a larger opening is formed at the cut. Since the first direction D1 is along the first side 114 of the first substrate 110 and is from the first substrate 110 toward the first light-emitting diodes 120, the opening close to the bottom surface 112 of the first substrate 110 is larger, so that as getting farther away from the bottom surface 112 of the first substrate 110, the third side 132 of the first encapsulation adhesive 130 is getting farther away from the first side 114 of the first substrate 110. The second direction D2 is along the second side 116 of the first substrate 110 and is from the first light-emitting diodes 120 toward the first substrate 110, the opening close to the first light-emitting diodes 120 of the first substrate 110 is larger, so that as getting farther away from the bottom surface 112 of the first substrate 110, the fourth side 134 of the first encapsulation adhesive 130 is getting closer to the second side 116 of the first substrate 110. As such, the third side 132 and the fourth side 134 are inclined toward the same side. Also, a distance d1 between the third side 132 of the first encapsulation adhesive 130 and the first side 114 of the first substrate 110 is smaller than a distance d2 between the fourth side 134 of the first encapsulation adhesive 130 and the second side 116 of the first substrate 110 at an extension direction of the bottom surface 112.

The third side 132 and the fourth side 134 of the first encapsulation adhesive 130 are not perpendicular to the bottom surface 112 of the first substrate 110. The extended surface of the bottom surface 112 of the first substrate 110 and the third side 132 of the first encapsulation adhesive 130 form a third angle a3, and the extended surface of the bottom surface 112 of the first substrate 110 and the fourth side 134 of the first encapsulation adhesive 130 form a fourth angle a4. The third angle a3 is greater than the first angle a1, and the fourth angle a4 is smaller than the second angle a2. For example, the first angle a1 and the second angle a2 may be right angles, the third angle a3 may be an obtuse angle, and the fourth angle a4 may be an acute angle.

Figure 5:
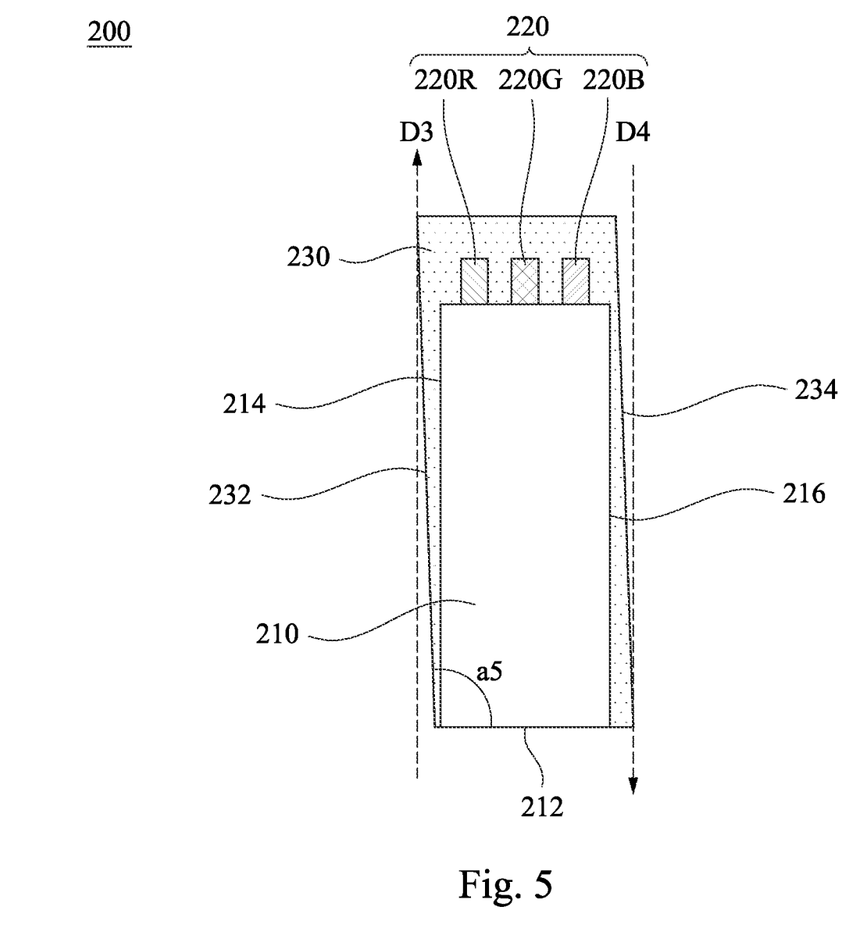

Referring to FIG. 5, after cutting the first package 100, the second package 200 may be cut by the same method. The second package 200 may be the same or similar package as the first package 100. The second package 200 includes a second substrate 210, a plurality of second light-emitting diodes 220, and a second encapsulation adhesive 230. The second substrate 210 includes a bottom surface 212, a fifth side 214 and a sixth side 216. The fifth side 214 and the sixth side 216 of the second substrate 210 are opposite sides. The plurality of second light-emitting diodes 220 are on the second substrate 210. In some embodiments, the second light-emitting diodes 220 may include a red light-emitting diode chip 220R, a green light-emitting diode chip 220G, and a blue light-emitting diode chip 220B. The second encapsulation adhesive 230 covers the fifth side 214 and the sixth side 216 of the second substrate 210 and the second light-emitting diodes 220.

When cutting the second package 200, the second encapsulation adhesive 230 of the second package 200 is cut along a third direction D3 beside the fifth side 214 of the second substrate 210, and a seventh side 232 of the second encapsulation adhesive 230 of the second package 200 is formed. Subsequently, the second encapsulation adhesive 230 of the second package 200 is cut along a fourth direction D4 beside the sixth side 216 of the second substrate 210, and a eighth side 234 of the second encapsulation adhesive 230 of the second package 200 is formed. The third direction D3 is opposite to the second direction D2, and the third direction D3 is opposite to the fourth direction D4. The seventh side 232 of the second encapsulation adhesive 230 and the extended surface of the bottom surface 212 of the second substrate 210 form a fifth angle a5. Since the third direction D3 is opposite to the second direction D2, the opening close to the bottom surface 212 of the second substrate 210 is larger, so that the fifth angle a5 is an obtuse angle. The other details of the second package 200 are similar or the same as those of the first package 100, and the details of cutting the second package 200 are similar or the same as those of cutting the first package 100. Therefore, the details are not repeatedly described herein.

Figure 6:
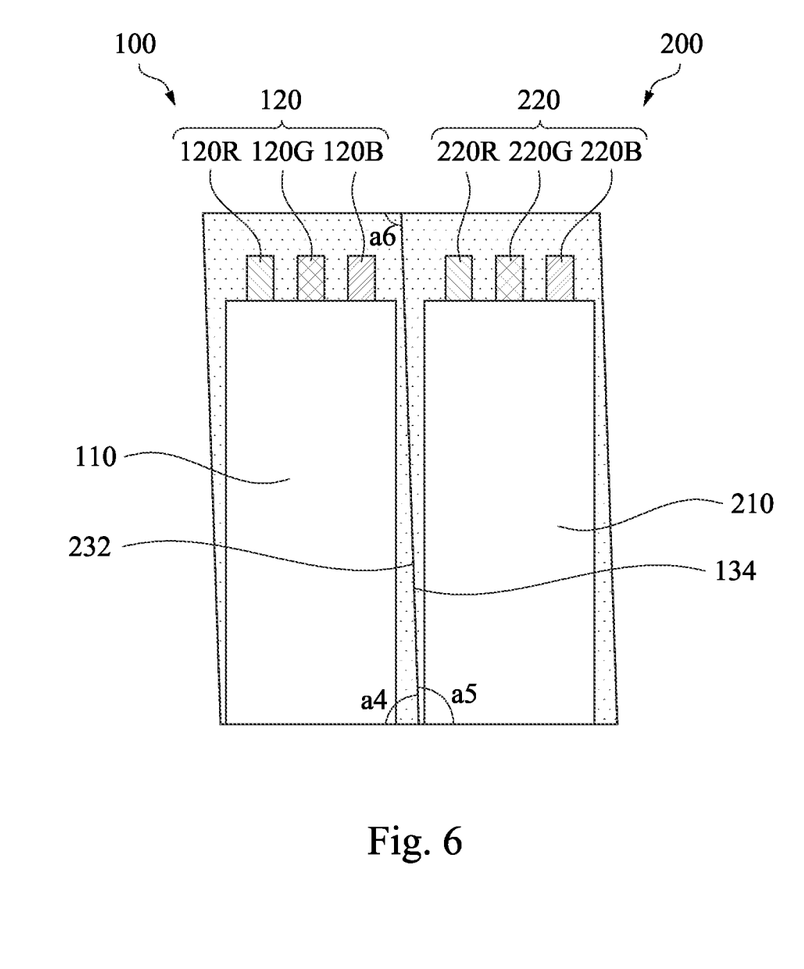

Referring to FIG. 6, the second package 200 is arranged adjacent to the fourth side 134 of the first encapsulation adhesive 130 of the first package 100. Specifically, the seventh side 232 of the second encapsulation adhesive 230 of the second package 200 is in contact with the fourth side 134 of the first encapsulation adhesive 130 of the first package 100. Since the fourth side 134 of the first encapsulation adhesive 130 and the seventh side 232 of the second encapsulation adhesive 230 are cut in opposite directions, the fourth side 134 of the first encapsulation adhesive 130 and the seventh side 232 of the second encapsulation adhesive 230 are inclined toward the same direction, and the top surface and the fourth side 134 of the first encapsulation adhesive 130 form a sixth angle a6, and the sixth angle a6 is greater than the second angle a2. When tiling the first package 100 and the second package 200 together, the fourth side 134 of the first encapsulation adhesive 130 and the seventh side 232 of the second encapsulation adhesive 230 are contact with each other, and the seventh side 232 of the second encapsulation adhesive 230 is on the fourth side 134 of the first encapsulation adhesive 130. Stated another way, the fifth angle a5 is an obtuse angle, and the fourth angle a4 is an acute angle. When tiling the first package 100 and the second package 200 together, the fourth side 134 of the first encapsulation adhesive 130 overlaps the seventh side 232 of the second encapsulation adhesive 230 in the vertical direction. As such, the first package 100 and the second package 200 are arranged closely. It is not easy for users to be aware of the gap between the first package 100 and the second package 200 when using the display panels including the first package 100 and the second package 200, so the gap between the first package 100 and the second package 200 does not easily affect the image generated by the display panel. In some embodiments, the suitable first package 100 and the second package 200 are chosen, so that the fifth angle a5 and the fourth angle a4 are supplementary angles. The first package 100 and the second package 200 are arranged more closely.

The method of forming the first package 100 and the second package 200 may be used to form other packages, and the packages are tiled by the method shown in FIG. 6. As such, the packages are arranged more closely, the gap between the packages does not easily affect the image.

Figure 7:
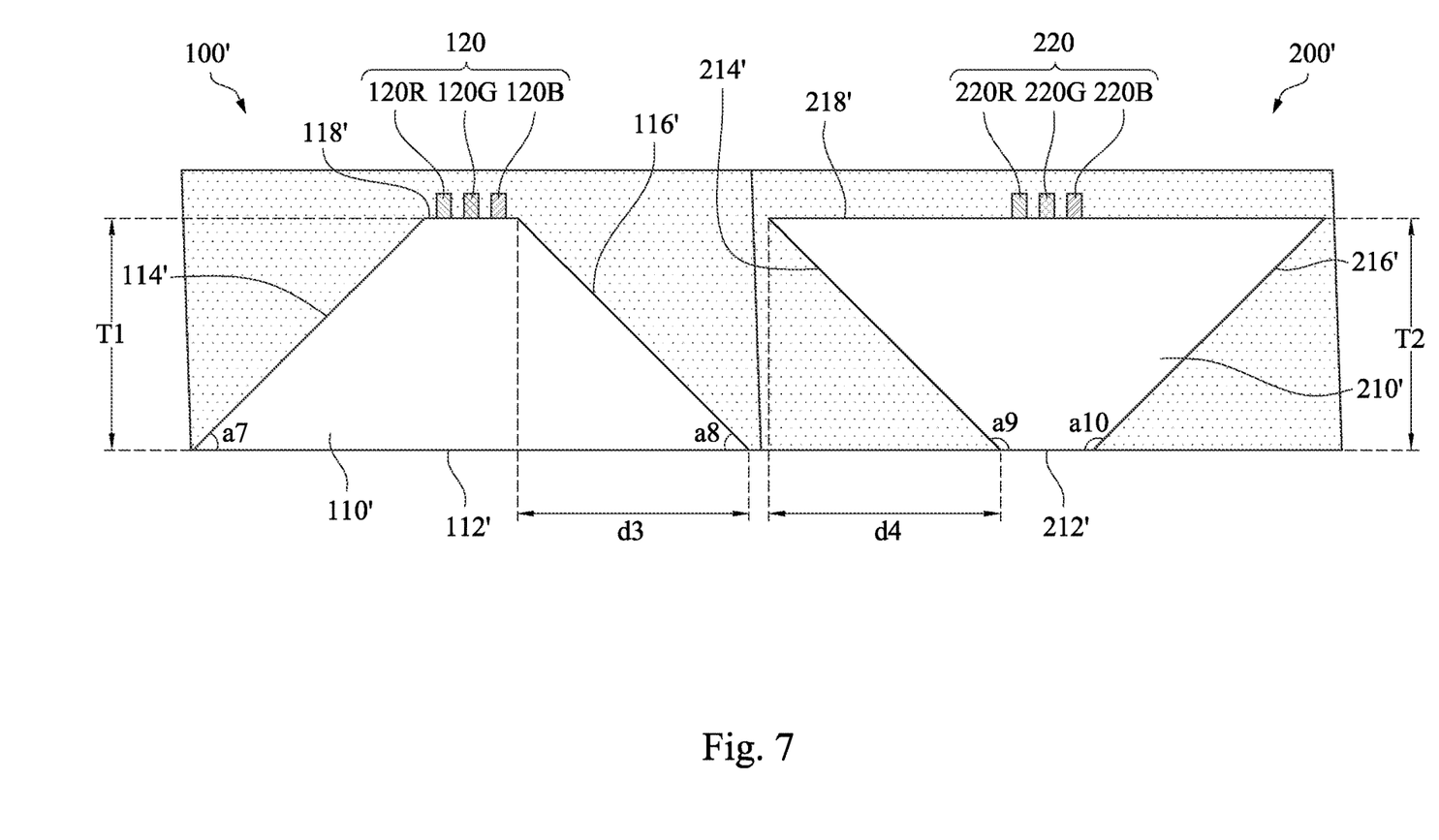
FIG. 7 illustrates a cross-section view of the display panel in some other embodiments of the present disclosure.

FIG. 7 illustrates a cross-section view of the display panel in some other embodiments of the present disclosure. The display panel in FIG. 7 includes a first package 100' and the second package 200'. The first package 100' and the second package 200' are respectively similar to the first package 100 and the second package 200 in FIG. 6, and the difference is that the first substrate 110' of the first package 100' and the second substrate 210' of the second package 200' have inclined surfaces formed by bevel cutting. The adjacent sides of the first package 100' and the second package 200' are inclined toward the same direction.

Specifically, in FIG. 7, the top surface 118' of the first substrate 110' is narrower than the bottom surface 112' of the first substrate 110', and the edge of the bottom surface 112' and the edge of the top surface 118' of the first substrate 110' have a first horizontal distance d3 therebetween. The top surface 218' of the second substrate 210' is wider than the bottom surface 212' of the second substrate 210', and the edge of the bottom surface 212' and the edge of the top surface 218' of the second substrate 210' have a second horizontal distance d4 therebetween. The first side 114' and the bottom surface 112' of the first substrate 110' of the first package 100' form a seventh angle a7, and the second side 116' and the bottom surface 112' of the first substrate 110' of the first package 100' form an eighth angle a8. Moreover, the fifth side 214' and the bottom surface 212' of the second substrate 210' of the second package 200' form a ninth angle a9, and the sixth side 216' and the bottom surface 212' of the second substrate 210' of the second package 200' form a tenth angle a10. In some embodiments, the seventh angle a7 and the eighth angle a8 are from 45 degrees to 90 degrees, and the ninth angle a9 and the tenth angle a10 are from 90 degrees to 135 degrees. As such, the adjacent sides of the first package 100' and the second package 200' (such as the second side 116' and the fifth side 214') are inclined toward the same direction. When the seventh angle a7 or the eighth angle a8 are within the disclosed range, the first horizontal distance d3 is smaller than the thickness T1 of the first substrate 110'. When the ninth angle a9 or the tenth angle a10 are within the disclosed range, the second horizontal distance d4 is smaller than the thickness T2 of the second substrate 210'. Therefore, the distance between the first light-emitting diodes 120 on the first packages 100' and the second light-emitting diodes 220 on the second packages 200' are suitable for the mini light-emitting diode display panels and the micro light-emitting diode display panels. Other details of FIG. 7 are similar or the same as those of FIG. 6. The details are not repeatedly described herein.

As mentioned above, using the method in some embodiments of the present disclosure to cut the encapsulation adhesive of the packages may achieve some advantages. Cutting the encapsulation adhesive in opposite directions may make the sides of the encapsulation adhesive inclined toward the same direction. When tiling different packages together, the sides of the encapsulation adhesive inclined toward the same direction may be in contact with each other, so that the packages are closely arranged. As such, It is not easy for users to be aware of the gap between the packages when using the display panels including the packages in some embodiments of the present disclosure, so the gap between the packages does not easily affect the image generated by the display panel.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display panel, comprising:
   a first package, comprising:
      a first substrate, wherein the first substrate comprises a bottom surface, a first side and a second side, the first side of the first substrate and the second side of the first substrate are opposite sides, and the bottom surface of the first substrate and the first side of the first substrate form a first angle, the bottom surface of the first substrate and the second side of the first substrate form a second angle;
      a plurality of first light-emitting diodes on the first substrate; and
      a first encapsulation adhesive covering the first side of the first substrate, the second side of the first substrate and the first light-emitting diodes, wherein the first encapsulation adhesive has a third side adjacent to the first side of the first substrate and a fourth side adjacent to the second side of the first substrate, and the bottom surface of the first substrate and the third side of the first encapsulation adhesive form a third angle, the bottom surface of the first substrate and the fourth side of the first encapsulation adhesive form a fourth angle, wherein the third angle is greater than the first angle, and the fourth angle is smaller than the second angle.

2. The display panel of claim 1, wherein the first angle and the second angle are right angles.

3. The display panel of claim 1, wherein as getting farther away from the bottom surface of the first substrate, the third side of the first encapsulation adhesive is getting farther away from the first side of the first substrate, and the fourth side of the first encapsulation adhesive is getting closer to the second side of the first substrate.

4. The display panel of claim 1, further comprising a second package adjacent to and in contact with the first package, wherein the second package comprises:
   a second substrate, wherein the second substrate comprises a bottom surface and a fifth side, wherein the fifth side of the second substrate is adjacent to the second side of the first substrate;
   a plurality of second light-emitting diodes on the second substrate; and
   a second encapsulation adhesive covering the fifth side of the second substrate and the second light-emitting diodes, wherein the second encapsulation adhesive has a sixth side adjacent to the fifth side of the second substrate, and the bottom surface of the second substrate and the sixth side of the second encapsulation adhesive form a fifth angle, one of the fifth angle and the fourth angle is an acute angle, and the other is an obtuse angle.

5. The display panel of claim 4, wherein the fifth angle and the fourth angle are supplementary angles.

6. The display panel of claim 1, wherein a top surface and the fourth side of the first encapsulation adhesive form a sixth angle, and the sixth angle is greater than the second angle.

7. A display panel, comprising:
   a first package, comprising:
      a first substrate, wherein the first substrate comprises a bottom surface, a first side and a second side, the first side of the first substrate and the second side of the first substrate are opposite sides;
      a plurality of first light-emitting diodes on the first substrate; and
      a first encapsulation adhesive covering the first side of the first substrate, the second side of the first substrate and the first light-emitting diodes, wherein the first encapsulation adhesive has a third side adjacent to the first side of the first substrate and a fourth side adjacent to the second side of the first substrate; and
   a second package, comprising;
      a second substrate, wherein the second substrate comprises a bottom surface, a fifth side and a sixth side, the fifth side and the sixth side of the second substrate are opposite sides, wherein the fifth side of the second substrate is adjacent to the second side of the first substrate;
      a plurality of second light-emitting diodes on the second substrate; and
      a second encapsulation adhesive covering the fifth side of the second substrate and the second light-emitting diodes, wherein the second encapsulation adhesive has a seventh side, the seventh side of the second encapsulation adhesive of the second package is in contact with the fourth side of the first encapsulation adhesive of the first package and are inclined toward the same direction.

8. The display panel of claim 7, wherein a top surface of the first substrate is narrower than the bottom surface of the first substrate, and an edge of the bottom surface and an edge of the top surface of the first substrate have a first horizontal distance therebetween, and a top surface of the second substrate is wider than the bottom surface of the second substrate, and an edge of the bottom surface and an edge of the top surface of the second substrate have a second horizontal distance therebetween.

9. The display panel of claim 8, wherein the first horizontal distance is smaller than a thickness of the first substrate, and the second horizontal distance is smaller than a thickness of the second substrate.

10. The display panel of claim 7, wherein the first side and the bottom surface of the first substrate of the first package form a first angle, and the second side and the bottom surface of the first substrate of the first package form a second angle, the first angle and the second angle are from 45 degrees to 90 degrees.

11. The display panel of claim 10, wherein the fifth side and the bottom surface of the second substrate of the second package form a third angle, and the sixth side and the bottom surface of the second substrate of the second package form a fourth angle, the third angle and the fourth angle are from 90 degrees to 135 degrees.

12. A method of forming a display panel, comprising:
   disposing a plurality of first light-emitting diodes on a first substrate, wherein the first substrate comprises a bottom surface, a first side and a second side, the first side of the first substrate and the second side of the first substrate are opposite sides, and the bottom surface of the first substrate and the first side of the first substrate form a first angle, the bottom surface of the first substrate and the second side of the first substrate form a second angle;

disposing a first encapsulation adhesive, so that the first encapsulation adhesive covers the first side of the first substrate, the second side of the first substrate and the first light-emitting diodes;

cutting the first encapsulation adhesive along a first direction from the first substrate toward the first light-emitting diodes, and forming a third side of the first encapsulation adhesive; and cutting the first encapsulation adhesive along a second direction from the first light-emitting diodes toward the first substrate, and forming a fourth side of the first encapsulation adhesive to form a first package.

13. The method of claim 12, wherein a distance between the third side and the first side is smaller than a distance between the fourth side and the second side at an extension direction of the bottom surface.

14. The method of claim 12, further comprising:

cutting a second encapsulation adhesive of a second package along a third direction, and forming a fifth side of the second encapsulation adhesive of the second package, wherein the third direction is opposite to the second direction; and arranging the second package adjacent to the fourth side of the first package.

15. The method of claim 14, wherein the third side of the first encapsulation adhesive and the bottom surface of the first substrate form a third angle, the fourth side of the first encapsulation adhesive and the bottom surface of the first substrate form a fourth angle, wherein the third angle is greater than the first angle, and the fourth angle is smaller than the second angle.

16. The method of claim 15, wherein the fifth side of the second encapsulation adhesive of the second package is in contact with the first encapsulation adhesive of the first package, and the fifth side of the second encapsulation adhesive and the bottom surface of a second substrate of the second package form a fifth angle, one of the fifth angle and the fourth angle is an acute angle, and the other is an obtuse angle.

17. The method of claim 16, wherein the fifth angle and the fourth angle are supplementary angles.

18. The method of claim 14, wherein the fourth side of the first encapsulation adhesive overlaps the fifth side of the second encapsulation adhesive in a vertical direction.

19. The method of claim 14, further comprising:

cutting the second encapsulation adhesive of the second package along a fourth direction, and forming a sixth side of the second encapsulation adhesive of the second package, wherein the third direction is opposite to the fourth direction.

20. The method of claim 12, wherein the third side and the fourth side are inclined toward the same side.

* * * * *